United States Patent [19]

Sakamoto

[11] Patent Number: 4,606,033

[45] Date of Patent: Aug. 12, 1986

[54] COMBINATION REFRACTIVE INDEX-GUIDING TYPE AND A GAIN-GUIDING TYPE SEMICONDUCTOR LASER DEVICE

[75] Inventor: Masamichi Sakamoto, Isehara, Japan

[73] Assignee: Sony Corporation, Tokyo, Japan

[21] Appl. No.: 535,789

[22] Filed: Sep. 26, 1983

[30] Foreign Application Priority Data

Sep. 30, 1982 [JP] Japan .................................. 57-172201

[51] Int. Cl.$^4$ ................................................ H01S 3/19
[52] U.S. Cl. ........................................ 372/45; 357/17; 372/46
[58] Field of Search ................ 372/44, 45, 46; 357/17

[56] References Cited

PUBLICATIONS

*McGraw-Hill Encyclopedia of Science and Technology,* Copyright 1960–1966 and 1971, p. 460.

*Primary Examiner*—James W. Davie
*Attorney, Agent, or Firm*—Hill, Van Santen, Steadman & Simpson

[57] ABSTRACT

A semiconductor laser device having a light emission region of a stripe pattern formed on a flat active layer, a portion carrying out a refractive index-guiding function formed on the light end portion of the light emission region and a portion carrying out a gain-guiding function formed inside the end portion of the light emission region.

4 Claims, 10 Drawing Figures

COMBINATION REFRACTIVE INDEX-GUIDING TYPE AND A GAIN-GUIDING TYPE SEMICONDUCTOR LASER DEVICE

BACKGROUND OF THE INVENTION

1. Field of the Invention

The present invention relates generally to semiconductor laser devices and more particularly relates to a semiconductor laser device which is suitable for use as a recording and/or readout light source of a recording and/or reproducing apparatus for an optical video disc, a digital audio disc and so on.

2. Description of the Prior Art

Roughly classified, conventional semiconductor laser devices are of a refractive index-guiding type and a gain-guiding type regarding its confinement mechanism in the vertical direction mode.

An example of such refractive index-guiding type semiconductor laser device is shown in, for example, FIG. 1. This semiconductor laser device is formed such that on an N type GaAs substrate 1 are epitaxially grown in turn an N type first cladding layer 2 made of $Al_yGa_{1-y}As$, an N type active layer 3 made of $Al_xGa_{1-x}As$, an N type second cladding layer 4 made of $Al_yGa_{1-y}As$ and an N type GaAs capping layer 5 and at the center thereof a high refractive index layer 6 of a stripe pattern is formed by injecting thereinto P type impurity Zn according to the selective diffusion or the like in the direction perpendicular to the sheet of drawing in FIG. 1. The depth of this high refractive index layer 6 is selected substantially deep enough to reach into the active layer 3 or further to the first cladding layer 2 by several thousand Å (angstroms). On the surface of the semiconductor layer 5 is formed an insulated layer 7 made of $SiO_2$ or the like through which an electrode window is formed. And, one electrode 8 is deposited on the high refractive index layer 6 through the above electrode window in the ohmic contact, while the other electrode 9 is deposited on the lower surface of the N type GaAs substrate 1 in the same ohmic contact. As described above, refractive index differences are generated in the active layer 3 depending on whether there exists the high refractive index layer 6 in the active layer 3 or not and thereby the light emission region is restricted.

On the other hand, an example of the gain-guiding type semiconductor laser device is shown in, for example, FIG. 2. Also in this case, this gain-guiding type semiconductor laser device is formed as follows: On an N type GaAs substrate 1 are epitaxially grown in turn an N type first cladding layer 2 made of $Al_yGa_{1-y}As$, an N or P type active layer 3 made of $Al_xGa_{1-x}As$, a P type second cladding layer 4 made of $Al_yGa_{1-y}As$ and an N type GaAs capping layer 5 and at the center thereof a stripe region 10 is formed by selectively diffusing P type impurity, for example, Zn which is extended to the direction perpendicular to the sheet of drawing in FIG. 2. The depth of this stripe region 10 is selected deep enough to reach into the second cladding layer 4. Also in this case, on the semiconductor layer 5 is deposited an insulated layer 7 through which a stripe pattern electrode window is formed. And, one electrode 8 is deposited on the region 10 through the stripe pattern electrode window in ohmic contact, and the other electrode 9 is deposited on the lower surface of the N type GaAs substrate 1 in ohmic contact. In the gain-guiding type semiconductor laser device thus made, the stripe region 10 allows the concentration of a drive current and the drive current injected into the portion just near or under the stripe region 10 allows the laser oscillation within the active layer 3. Namely, the gain distribution due to the concentration distribution in the transverse direction of the carrier injected into the active layer 3 determines the transverse mode.

Although the above refractive index-guiding and gain-guiding type semiconductor laser devices have advantages respectively, they but are not free from respective defects. More particularly, the refractive index-guiding type semiconductor laser device, since its longitudinal mode is a single mode, is poor against noises caused by a returned light when used as the writing and/or readout light source for, for example, the optical video disc and so on. On the other hand, since a so-called beam waist position exists close to the light end of the light emission region, this refractive index-guiding type semiconductor laser device has an advantage that in the practical use the focal position can be determined with ease. Furthermore, since a long distance image in the cross section parallel to the junction plane, namely, a so-called far field pattern is symmetrical with respect to left and right sides, there is then an advantage that a beam spot having less distortion can be obtained with ease as the readout or writing light in the practical use. While, in the above gain-guiding type semiconductor laser, since the beam waist position exists near the inside by approximately 20 μm from the light end of the light emission region and further the far field pattern is asymmetrical with respect to left and right sides, there is a defect that an astigmatism is large and the distortion of the beam spot becomes relatively large. However, in this gain-guiding type semiconductor laser device, its longitudinal mode is multimode so that this device is less affected by the noises caused by the returned light.

OBJECTS AND SUMMARY OF THE INVENTION

Accordingly, it is an object of the present invention to provide a semiconductor laser device which can remove the above defects inherent in the refractive index-guiding and gain-guiding semiconductor laser devices and which can have a particularly convenient combination of advantageous characteristics of both the above type semiconductor laser devices.

It is another object of the present invention to provide a semiconductor laser device which is suitable as the writing or readout light source of a recording and/or reproducing apparatus, for example, an optical video disc, a digital audio disc and so on.

It is a further object of the present invention to provide a semiconductor laser device which can obtain a beam spot of superior shape when used as the above light source.

It is a yet further object of the present invention to provide a semiconductor laser device which can facilitate the designing of optical lens system and so on in the use of the above light source.

According to one aspect of the present invention, there is provided a semiconductor laser device in which a first cladding layer, an active layer, a second cladding layer, a capping layer and a second electrode are formed a first major surface of a semiconductor substrate having a first electrode on its second major surface and a heterojunction is formed between said active layer and said first and second cladding layers respectively comprising:

(a) a stripe light emission region formed on a substantially flat active layer;
(b) refractive index-guiding operating means formed at least one light end portion of said stripe light emission region; and
(c) gain-guiding operating means formed at least on one portion inside said end portion of said stripe light emission region.

According to another aspect of the present invention, there is provided a semiconductor laser device in which a first cladding layer, an active layer, a second cladding layer, a capping layer and a second electrode are formed on a first major surface of a semiconductor substrate having a first electrode on its second major surface and a heterojunction is formed between said active layer and said first and second cladding layers respectively comprising:

(a) a stripe light emission region formed of an impurity layer; and
(b) a light absorption layer having a spacing substantially same as a width of said light emission region in at least one light end portion of said light emission region and having a spacing wider than the width of said light emission region in at least one portion inside said end portion of said light emission region.

The other objects, features and advantages of the present invention will become apparent from the following description taken in conjunction with the accompanying drawings through which the like references designate the same elements and parts.

DESCRIPTION OF THE PREFERRED EMBODIMENTS

Figure 3:
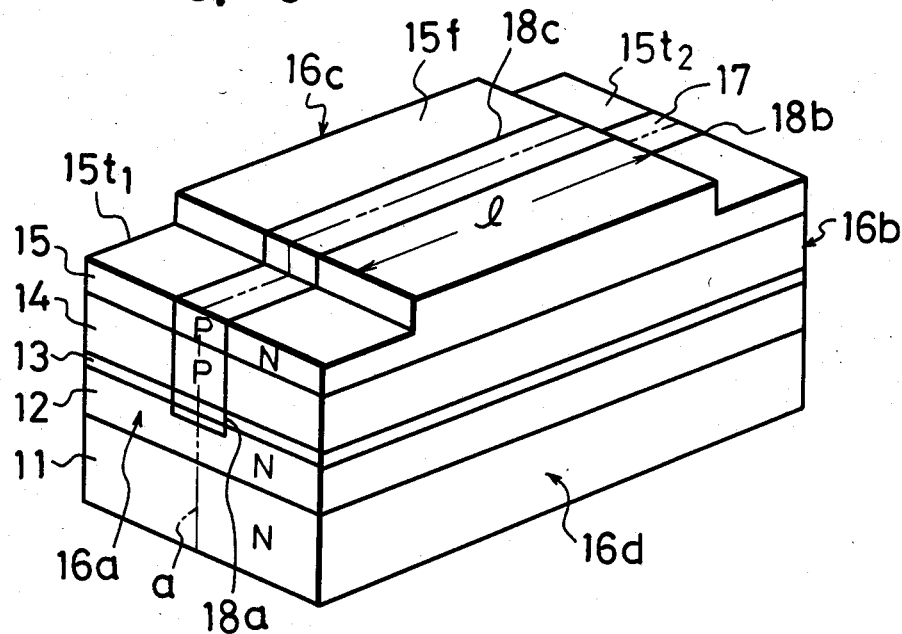
FIG. 3 is an enlarged perspective view of an embodiment of a semiconductor laser device according to the present invention.

A first embodiment of the present invention will hereinafter be described with reference to FIGS. 3 and 4. FIG. 3 is an enlarged schematic perspective view of the first embodiment of the semiconductor laser device according to the present invention, while FIG. 4 is an enlarged schematic cross-sectional and perspective view taken along the plane shown by a two-dot chain line a in FIG. 3.

Figure 4:
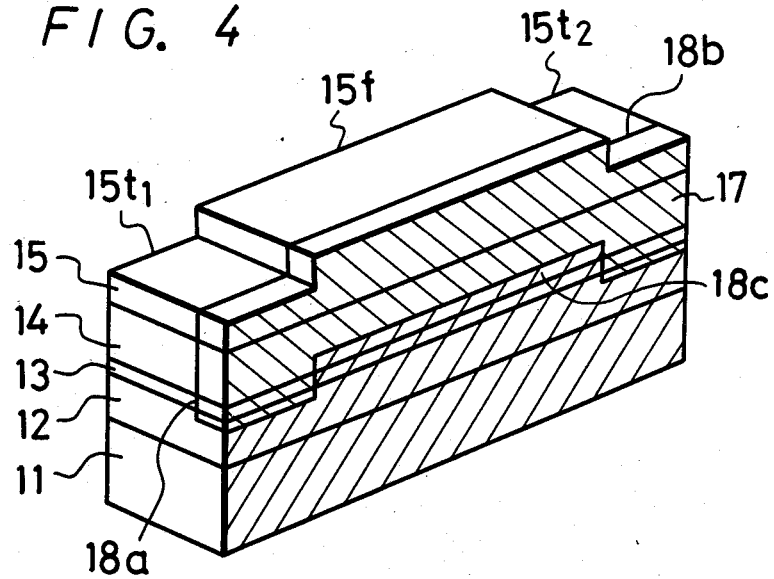
FIG. 4 is a cross-sectional enlarged and perspective view taken along the chain line a in FIG. 3.

In the embodiment of the present invention shown in FIGS. 3 and 4, reference numeral 11 designates a first conductive type substrate, for example, N type GaAs single crystalline substrate. On one major surface therof are epitaxially grown in turn a first semiconductor layer 12 of the same conductive type as the substrate 11 which serves as both the buffer layer and the first cladding layer made of, for example, N type $Al_yGa_{1-y}As$ layer, a second semiconductor layer 13 of the first conductive type or counter second conductive type which serves as the active layer made of, for example, $Al_xGa_{1-x}As$ layer, a third semiconductor layer 14 of the second conductive type which serves as the second cladding layer made of, for example, P type $Al_yGa_{1-y}As$ layer and a fourth semiconductor layer 15 of the first conductive type which serves as the capping layer made of, for example, N type GaAs layer. The epitaxial growth of these semiconductor layers 12 to 15 can be carried out by a series of works according to a thermal decomposition method or LPE (liquid phase epitaxy) method and so on which uses, for example, trimethyl aluminium, trimethyl gallium, arsine as its reactive gas. When the semiconductor laser device is practically manufactured, the semiconductor wafer which is formed by epitaxially growing the respective semiconductor layers 12 to 15 on the substrate 11 in turn is pelletized and then a plurality of semiconductor laser devices is provided. In this case, surfaces 16a and 16b opposing to each other which serves as the output end of a laser light are each a cleavage plane upon pelletizing and the other side surfaces 16c and 16d opposing to each other can be obtained by an arbitrary method such as a mechanical cutting method and so on.

Figure 1:
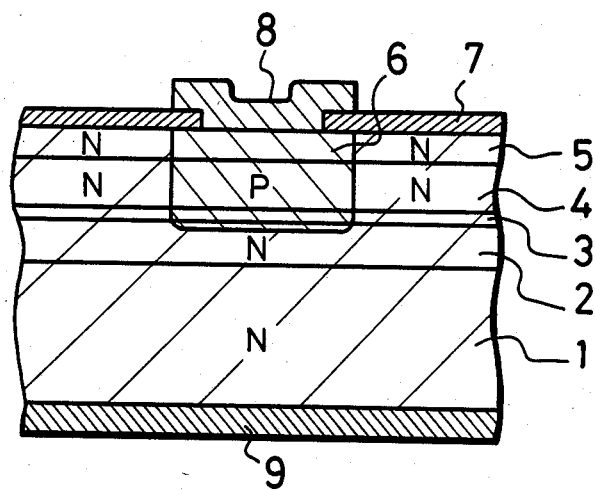
FIGS. 1 and 2 are respectively enlarged cross-sectional views of conventional semiconductor laser devices.
Figure 2:
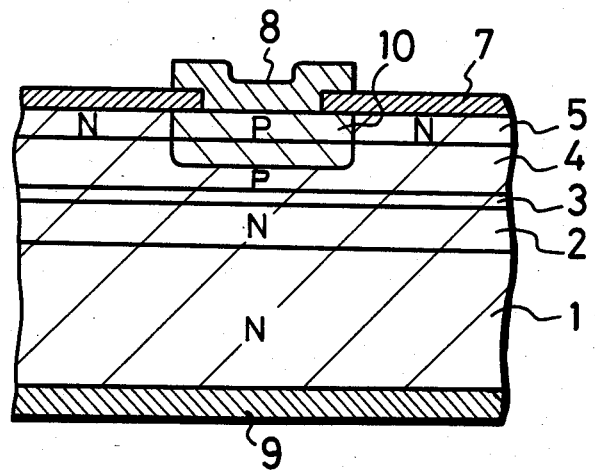

Before the semiconductor wafer being subjected to, for example, the above pelletize work, the semiconductor layer 15 is, for example, selectively etched to form grooves with a predetermined spacing l kept therebetween along the direction in which the side surfaces 16a and 16b are formed, by which a thick portion 15f is formed on the center portion of the semiconductor layer 15 and thin portions $15_{t1}$ and $15_{t2}$ are formed at the both sides of the thick portion 15f. After that, Zn which is P type, namely second conductive type impurity is selectively introduced across the thin portion $15_{t1}$, the thick portion 15f and the thin portion $15_{t2}$ from the surface side of the capping layer 15 in a stripe pattern by using the diffusion method or ion injection method and so on. In this case, the depth of the injected impurity Zn from the surface is made substantially uniform in each portion so that the position of the bottom surface of a region 17 into which the impurity was injected is made different in the portions in which the thick portion 15f exists and the thin portions $15_{t1}$ and $15_{t2}$ exist. More particularly, in this case, in the portions inside of the side surfaces 16a and 16b which will be formed by the later pelletize work, the impurity injected region 17 is extended into the active layer 13 or the first cladding layer 12 with a depth of several thousand Å, thus forming the refractive index-guiding operating means 18a and 18b described with reference to FIG. 1, in the portions inside of the side surfaces 16a and 16b, namely, the end faces. In the inside of the center portion having the thick portion 15f, the impurity injected region 17 is not extended to the active layer 13 but the bottom surface thereof exists in the second cladding layer 14 to thereby form the gain-guiding operating means 18c described with reference to FIG. 2. And, though not shown, one electrode (same as the electrode 8 in FIGS. 1 and 2) is deposited on the stripe region 17 in ohmic contact, while the other electrode (same as the electrode 9 in FIGS. 1 and 2) is deposited on the lower surface of the substrate 11 in ohmic contact.

Consequently, the semiconductor laser device according to the present invention is of such a construction that both of the refractive index-guiding type and gain-guiding type configurations are formed in the same semiconductor laser device. Namely, in accordance with the present invention, since the longitudinal mode for the laser oscillation is determined by the gain guiding mechanism which occupies the main portion within the cavity, the longitudinal mode is made the multi-mode. As a result, there is an advantage that the influence of the noise due to the returned light can be reduced. Moreover, since the refractive index-guiding operating means 18a and 18b are provided at the side surfaces of the oscillation region 17, namely, at the light end portions of the light output surfaces 16a and 16b, the beam waist position can be brought to the position of the end faces and the symmetry of the far field pattern with respect to left and right sides can be improved. Thus, the formation and the determination of the focal point of the beam spot when this semiconductor laser device is used as the light source become accurate and easy. Furthermore, the beam spot can be formed with less distortion.

The formation of the refractive index-guiding operating means 18a and 18b is not limited to the construction according to the Zn injected region 17 which reaches to the active layer 13. The refractive index-guiding operating means 18a and 18b can also be formed by the built-in refractive index difference which is made by a light absorption layer embedded into, for example, the second cladding layer 14.

Figure 5:
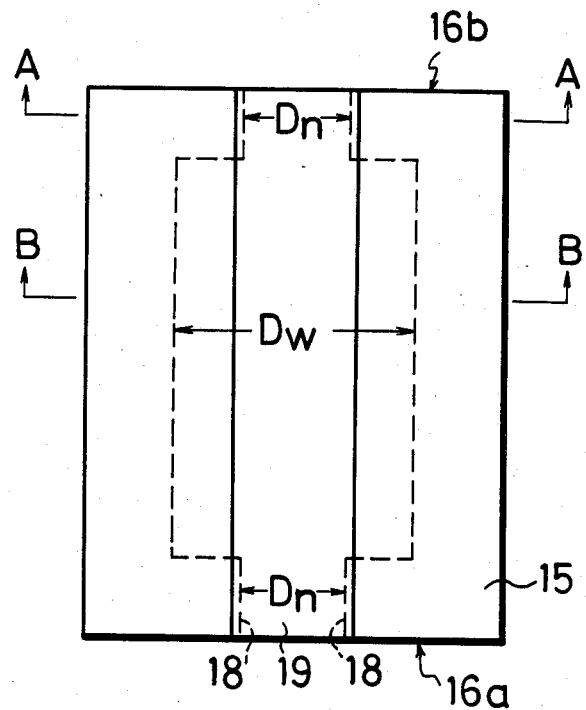
FIG. 5 is an enlarged plan view of another embodiment of the semiconductor laser device according to the present invention.
Figure 6:
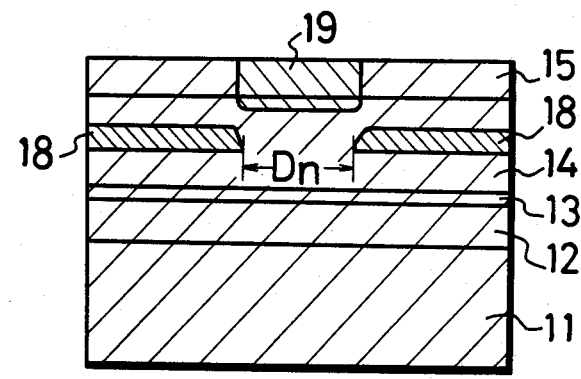
FIGS. 6 and 7 are respectively enlarged cross-sectional views taken along lines A—A and B—B in FIG. 5.
Figure 7:
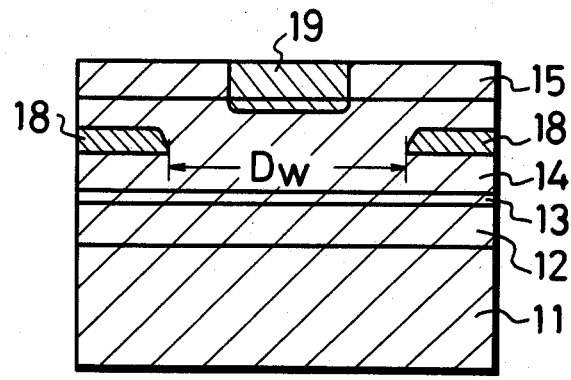

An example of such semiconductor laser device will be described with reference to FIGS. 5 to 7. FIG. 5 is an enlarged schematic plan view of such semiconductor laser device and FIGS. 6 and 7 are respectively enlarged cross-sectional views taken along lines A—A and B—B in FIG. 5. Throughout FIGS. 5 to 7, like parts corresponding to those of FIGS. 3 and 4 are marked with the same references and their overlapped description will be omitted. In this embodiment, light absorption layers 18 are embedded into the second cladding layer 14. The light absorption layer 18 has the forbidden band width equal to or smaller than that of the active layer 13 and has the refractive index equal to or higher than that of the active layer 13. In this embodiment, the surface of the capping layer 15 is formed flat and a stripe impurity region, for example, Zn injected region 19 of the second conductive type having a predetermined narrow width is provided on the capping layer 15 across both side surfaces 16a and 16b. The light absorption layers 18, as will be clear from the patterns thereof shown by a broken line in FIG. 5, are located beneath both sides of the stripe region 19, namely, at both sides of the stripe region 19 gripping the portion beneath it therebetween. Particularly the spacing between the light absorption layers 18 located at both sides of the stripe region 19 is narrowed at both end faces of the light emission region, namely, end portions facing to the side surfaces 16a and 16b so as to become a small spacing Dn which gets close to or enters into the portion just beneath the stripe region 19. Also, the above spacing is widened at the portion near the inside of both end portions (the central portion) so as to become a large spacing Dw which is distant from the portion just beneath the stripe region 19. In addition, the distance or spacing between the light absorption layer 18 and the active layer 13 is selected such that the light emitted from the active layer 13 can reach the light absorption layer 18, namely, the length equal to approximately the wavelength thereof.

With the semiconductor laser device having the construction as set forth above, due to the existence of the stripe region 19, the current path is restricted, namely, the current is concentrated and due to its gain-guiding operation, the drive current generated from the carrier injection is locally concentrated at the center portion of the active layer 13 at which the effective light emission region is generated. In addition, with the above structure, in the portion wherein the light absorption layers 18 provided at both ends of the stripe region 19 are located so as to close to the under side of the stripe region 19 or to approach just beneath the stripe region 19, the refractive index-guiding operation is generated by the refractive index difference due to substantially the influence by the provision of the layer 18. And, since in the center portion close to the inside from the both ends of the stripe region 19, the light absorption layers 18 are located enoughly distant apart from the portion just beneath the stripe region 19, only the gain-guiding operation due to the stripe region 19 is effective. That is, in the portion in which the light emitted from the light emission region in the active layer 13 reaches to the portion where the light absorption layers 18 exist, the absorption of light is carried out substantially and a refractive index difference occurs between the portion beneath the stripe region 19 and the both side regions gripping the portion beneath the stripe region 19. As a result, the built-in refractive index difference is generated so that the refractive index-guiding operation takes place in that portion, and hence particularly the end faces of the light emission region.

Therefore, also in the second embodiment of the invention, similarly as in the first embodiment described with reference to FIGS. 3 and 4, the refractive index-guiding type semiconductor laser device is presented which can form a superior laser beam spot in association with the characteristics of the refractive index guiding type and gain-guiding type semiconductor laser devices.

Figure 8:
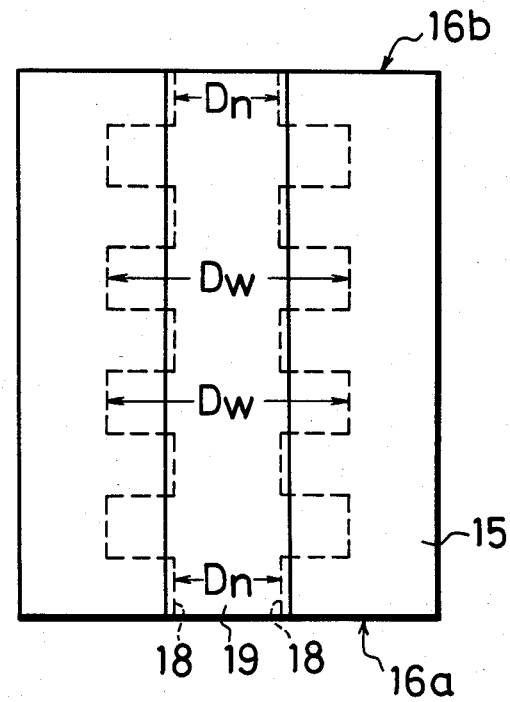
FIG. 8 is an enlarged plan view of other embodiment of the semiconductor laser device according to the present invention.

The light absorption layer 18 formed to be of such a pattern that as shown in FIG. 8 has the small spacing Dn at both ends of the stripe region 19 and inside of the stripe region 19 large and small spacings Dw and Dn alternately arranged in turn.

As the method for forming the above light absorption layer 18, such method is possible in which parts of the semiconductor layers 12 and 13 and the second cladding layer 14 are epitaxially grown on the semiconductor substrate 11 and the semiconductor layer, which will form the light absorption layer 18, is epitaxially grown thereon. After that, this epitaxial layer which constructs the light absorption layer 18 is selectively etched away so as to have the pattern shown in FIG. 5 or 8. The semiconductor layer 14 which constructs the second cladding layer is epitaxially grown so as to bury the etched away portion of the light absorption layer 18 and then the capping layer 15 is further epitaxially grown thereon. Thereafter, the stripe region 19 is formed by the selective diffusion or selective ion injection of impurity Zn.

With the construction in which the light absorption layer 18 is buried into the semiconductor layer 14 as shown in FIGS. 5 to 7 and FIG. 8, the respective semiconductor layers 12 to 15 can not be formed by a series of epitaxial growth but the etching process, for example, is interposed on the way of the epitaxial growth. Therefore, during this etching process, in the semiconductor layer containing, for example, particularly Al, since Al is apt to be oxidized, an oxide film is formed and hence contamination is caused. There is then a risk that the deterioration of characteristics may occur. If there is such risk, the light absorption layer 18 is not buried into the second cladding layer 14 but can be formed on the surface thereof finally.

Figure 9:
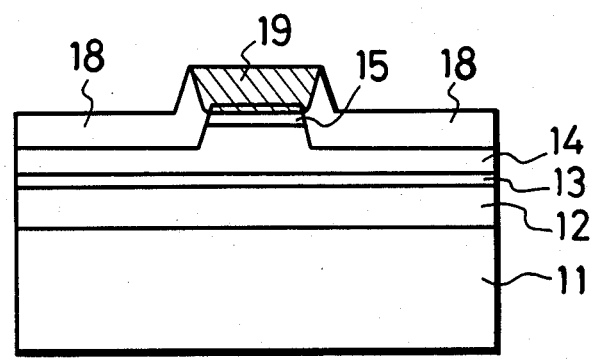
FIGS. 9 and 10 are respectively enlarged cross-sectional views of further embodiment of the semiconductor laser device according to the present invention in different surfaces.
Figure 10:
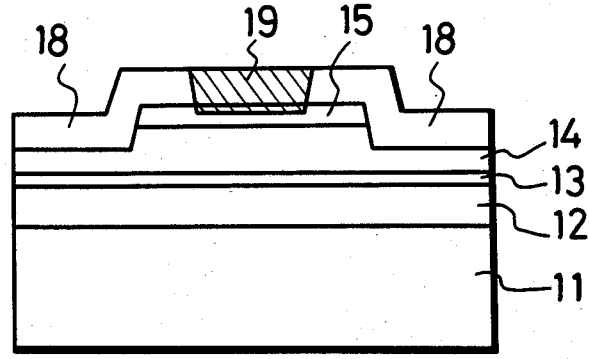

FIGS. 9 and 10 show the example of such case, respectively. FIG. 9 is an enlarged cross-sectional view of near the other side surface of the light emission region and FIG. 10 is an enlarged cross-sectional view of the portion further inside thereof. In FIGS. 9 and 10, like parts corresponding to those of FIGS. 6 and 7 are marked with the same references and the overlapped description will be omitted. In this case, the light absorption layer 18 is not buried into the cladding layer 14. After the epitaxial growth process of the semiconductor layers 12 to 15 is completed, the mesa-etching process is carried out to the depth from the capping layer 15 to the cladding layer 14 and the semiconductor layer, which will become the light absorption layer 18, is epitaxially grown thereon. After that, the stripe region 19 can be formed by selectively injecting impurity thereinto. Also in this case, the pattern of the light absorption layer 18, namely, the pattern of the mesa-etching, similarly as in FIGS. 5 and 8, is formed leading to the portion beneath the stripe region 19 such that the spacing between both sides gripping the stripe region 19 is formed as the narrow portion at both end faces of the light emission region, namely, facing to the current path and as the wide pattern or the wide and narrow pattern arranged in turn in the center portion.

As set forth above, according to the semiconductor laser device of the present invention, since the portions having the refractive index-guiding function mechanisms are provided at both ends of the light emission region and the portion having the gain-guiding function mechanism is provided in at least one portion inside of the both ends, the characteristics of both the refractive index-guiding and gain-guiding function mechanisms are presented in combined manner. In other words, according to the present invention, since the beam waist position is obtained at the end faces of the light emission region and the symmetry of the far field pattern is superior, it is possible to construct the semiconductor laser device which can easily obtain the focus having less spot distortion and whose optical system can be designed with ease.

Furthermore, since the semiconductor laser device according to the present invention has less noise due to the returned light, when used as the recording or read-out light source for the optical video disc and so on, the semiconductor laser device enables the recording and reproducing to be carried out accurately.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

I claim as my invention:

1. A semiconductor laser device which includes a resonant cavity and in which a first cladding layer, a light emitting active layer, a second cladding layer, a capping layer and a second electrode are formed on a first major surface of a semiconductor substrate having a first electrode on its second major surface wherein the improvement comprises:
    (a) a stripe light emission region formed on said substantially flat active layer;
    (b) refractive index-guiding operating means formed on at least one end portion of said stripe light emission region; and
    (c) gain-guiding operating means formed at one inside portion of said stripe light emission region.

2. A semiconductor laser device according to claim 1, wherein said at least one end portion of said stripe light emission region is thin.

3. A semiconductor laser device according to claim 2, wherein said stripe light emission region is formed by the ion injection of impurities.

4. A semiconductor laser device which includes a resonant cavity and in which a first cladding layer, a light emitting active layer, a second cladding layer, a capping layer and a second electrode are formed on a first major surface of a semiconductor substrate having a first electrode on its second major surface wherein the improvement comprises:
    (a) a stripe light emission region formed of an impurity layer in said semiconductor substrate over said active layer; and
    (b) a light absorption layer having a spacing substantially with the same width as said light emission region in at least one end portion of said light emission region and having a spacing wider than the width of said light emission region in at least one inside portion of said light emission region.

* * * * *